(12) United States Patent
Dangler et al.

(10) Patent No.: US 9,089,071 B2
(45) Date of Patent: Jul. 21, 2015

(54) IMPLEMENTING ENHANCED LOW LOSS, THIN, HIGH PERFORMANCE FLEXIBLE CIRCUITS

(75) Inventors: John R. Dangler, Rochester, MN (US); Matthew S. Doyle, Rochester, MN (US)

(73) Assignee: International Business Machines Corporation, Armonk, NY (US)

(*) Notice: Subject to any disclaimer, the term of this patent is extended or adjusted under 35 U.S.C. 154(b) by 487 days.

(21) Appl. No.: 13/535,792

(22) Filed: Jun. 28, 2012

(65) Prior Publication Data

US 2014/0005818 A1 Jan. 2, 2014

(51) Int. Cl.
*G06F 19/00* (2011.01)
*H05K 1/18* (2006.01)

(52) U.S. Cl.
CPC ...................... *H05K 1/189* (2013.01)

(58) Field of Classification Search
CPC ...................................................... H05K 1/189
USPC ...................... 700/95, 97, 117, 121; 703/1, 2; 716/100, 110, 118, 119, 132
See application file for complete search history.

(56) References Cited

U.S. PATENT DOCUMENTS

| | | | |
|---|---|---|---|
| 5,097,390 A | 3/1992 | Gerrie et al. | |
| 5,322,974 A | 6/1994 | Walston | |
| 5,528,001 A * | 6/1996 | Roberts | 174/268 |
| 5,584,120 A * | 12/1996 | Roberts | 29/846 |
| 5,652,055 A | 7/1997 | King et al. | |
| 5,819,579 A * | 10/1998 | Roberts | 72/412 |
| 5,950,305 A * | 9/1999 | Roberts | 29/848 |
| 6,092,282 A * | 7/2000 | Roberts | 29/848 |
| 6,162,996 A | 12/2000 | Schmidt et al. | |
| 6,489,012 B1 | 12/2002 | Yang et al. | |
| 6,528,732 B1 | 3/2003 | Okubora et al. | |
| 6,620,513 B2 | 9/2003 | Yuyama et al. | |
| 6,887,560 B2 | 5/2005 | Nakamura et al. | |
| 7,105,931 B2 * | 9/2006 | Attarwala | 257/783 |
| 7,575,955 B2 * | 8/2009 | Attarwala | 438/118 |
| 8,015,701 B2 | 9/2011 | Abrahamson et al. | |
| 8,298,366 B2 * | 10/2012 | Kaneshiro et al. | 156/324 |
| 8,450,239 B2 * | 5/2013 | Tatewaki et al. | 503/201 |
| 2001/0005545 A1 | 6/2001 | Andou et al. | |
| 2005/0155792 A1 * | 7/2005 | Ito et al. | 174/264 |
| 2005/0183883 A1 | 8/2005 | Bois et al. | |
| 2007/0102092 A1 * | 5/2007 | Dangler et al. | 156/64 |
| 2009/0011231 A1 * | 1/2009 | Kaneshiro et al. | 428/355 R |
| 2010/0065313 A1 | 3/2010 | Takeuchi et al. | |
| 2011/0308725 A1 * | 12/2011 | Kaneshiro et al. | 156/306.6 |

* cited by examiner

*Primary Examiner* — Charles Kasenge
(74) *Attorney, Agent, or Firm* — Joan Pennington

(57) ABSTRACT

A method, system and computer program product are provided for implementing enhanced low loss, thin, high performance flexible circuits. A plurality of predefined values including predefined layout, spacing and density of conductor, signal trace construct, shape and feature values are provided for each signal layer in a flexible circuit. Volumetric calculations are performed using the predefined values for each signal layer in the flexible circuit and a respective adjacent adhesive layer is characterized for each signal layer providing a respective optimized adjacent adhesive layer.

21 Claims, 15 Drawing Sheets

400

IMPLEMENTING ENHANCED LOW LOSS, THIN, HIGH PERFORMANCE FLEXIBLE CIRCUITS

FIELD OF THE INVENTION

The present invention relates generally to the data processing field, and more particularly, relates to a method, system and computer program product for implementing enhanced low loss, thin, high performance flexible circuits including enhanced adhesive layers.

DESCRIPTION OF THE RELATED ART

Multiple layer flexible circuits use adhesives between core material layers to bond and yield multiple signaling layers together. The core material layers typically include a flexible substrate that is an electrical insulator, such as polyimide, and an electrical conductor layer formed of copper or other suitable conductive material including gaps in copper between signal traces, shapes, and connector area copper features. A bonding film of the flexible circuit includes an electrical insulator layer or polyimide layer between an upper adhesive layer and a lower adhesive layer. After lamination of the flexible circuit a respective adhesive layer bonds to the electrical conductor layer of the respective adjacent core material layer.

An adhesive thickness for the respective adhesive layers is determined by the thickness needed to fill gaps in copper between shapes or in connector area copper features, and the thickness needed to encapsulate lines and features and fill all areas based upon the copper thicknesses. Limited standard adhesive thicknesses are available.

Many adhesives, such as DuPont FR and many others, have relatively high dissipation and dielectric properties and high thermal coefficients of expansion. Available adhesives are poor candidates for flexible circuit applications requiring: 1) thin cross sections; 2) low loss; and 3) high layer and high reliability.

Pure adhesive as a bonding film is not typically used to yield high-speed, high-performance packages, due to its poor SI and Z-axis of expansion characteristics. Limits in the conventionally-applied thickness of adhesive materials exist which inhibit their use in high-speed applications. Although other thickness sheet-adhesive products are available, 0.5 mils and 1.0 mil adhesive thickness are high volume products. Adhesive coatings of 0.5 mils are near the limit of how thin adhesive can be made using convention industry processing and standard flexible circuit technology.

A need exists for an effective mechanism and method of fabricating enhanced low loss, thin, high performance flexible circuits. It is desirable to provide such effective mechanism and method that minimizes adhesive layers reducing a thickness of each adhesive layer to provide mechanically thinner, lower electrical loss, potential for cost reduction and higher reliability packaging.

SUMMARY OF THE INVENTION

Principal aspects of the present invention are to provide to a method, system and computer program product for implementing enhanced low loss, thin, high performance flexible circuits. Other important aspects of the present invention are to provide such methods and structures substantially without negative effects and that overcome many of the disadvantages of prior art arrangements.

In brief, a method, system and computer program product are provided for implementing enhanced low loss, thin, high performance flexible circuits. A plurality of predefined values including predefined layout, spacing and density of conductor, signal trace construct, shape and feature values are provided for each signal layer in a flexible circuit. Volumetric calculations are performed using the predefined values for each signal layer in the flexible circuit and a respective adjacent adhesive layer is characterized for each signal layer providing a respective optimized adjacent adhesive layer.

In accordance with features of the invention, the respective characterized adjacent adhesive layer selectively reduces a thickness at multiple areas of the respective optimized adjacent adhesive layer to a minimum required or minimum predefined adhesive compensating for circuit density and copper thickness values.

In accordance with features of the invention, the respective characterized adjacent adhesive layer minimizes a thickness of the respective optimized adjacent adhesive layer providing enhanced or low thermal expansion for the flexible circuit design, and having higher reliability.

In accordance with features of the invention, the respective characterized adjacent adhesive layer minimizes a thickness of the respective optimized adjacent adhesive layer providing enhanced lower electrical loss and enhanced performance for the flexible circuit design.

In accordance with features of the invention, the respective characterized adjacent adhesive layer minimizes a thickness of the respective optimized adjacent adhesive layer providing the low loss, thin, high performance flexible circuit for the flexible circuit design.

In accordance with features of the invention, an electrical insulator layer, such as a polyimide layer is provided with the respective optimized adjacent adhesive layer. A thickness of the electrical insulator polyimide layer is increased with a decrease in a thickness of the respective optimized adjacent adhesive layer.

In accordance with features of the invention, by strategically reducing the amount of adhesive residing within the signal trace geometry cross section and providing an increased electrical insulator polyimide layer having a lower dissipation and dielectric properties, lower coefficient of thermal expansion (CTE), overall cross sectional thickness is reduced, lower electrical attenuation, or loss is reduced and higher reliability flexible circuit packages are produced.

In accordance with features of the invention, increased layer count is enabled within the same overall mechanical constraints and manufacturing limitations, and ability to package high-speed and low-speed signaling within the same medium is enabled without the need for marrying multiple material sets within the same package.

In accordance with features of the invention, improved jitter characteristics are provided and high-performance products are enabled utilizing conventional materials.

In accordance with features of the invention, the ability to modify cross section in desired areas, such as critical bend areas, to improve mechanical performance without requiring multiple material sets within the same package.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product are provided for implementing enhanced low loss, thin, high performance flexible circuits. The invention generally maintains use of existing industry processes in combination with conventional materials to yield high-performance flexible circuit packages. The invention provides the ability to modify cross section in desired areas, such as critical bend areas, to improve mechanical performance. The invention provides enhanced low loss, thin, high performance flexible circuits with reduced thickness cross sections, significant lower electrical attenuation, improved jitter characteristics, higher reliability, increased layer count within the same overall mechanical constraints and manufacturing limitations, and with reduced cost of high-performance constructs. The invention enables the ability to package high-speed and low-speed signaling within the same medium without the need for marrying multiple material sets within the same package, while providing enhanced electrical performance and enhanced mechanical performance.

Figure 1A:
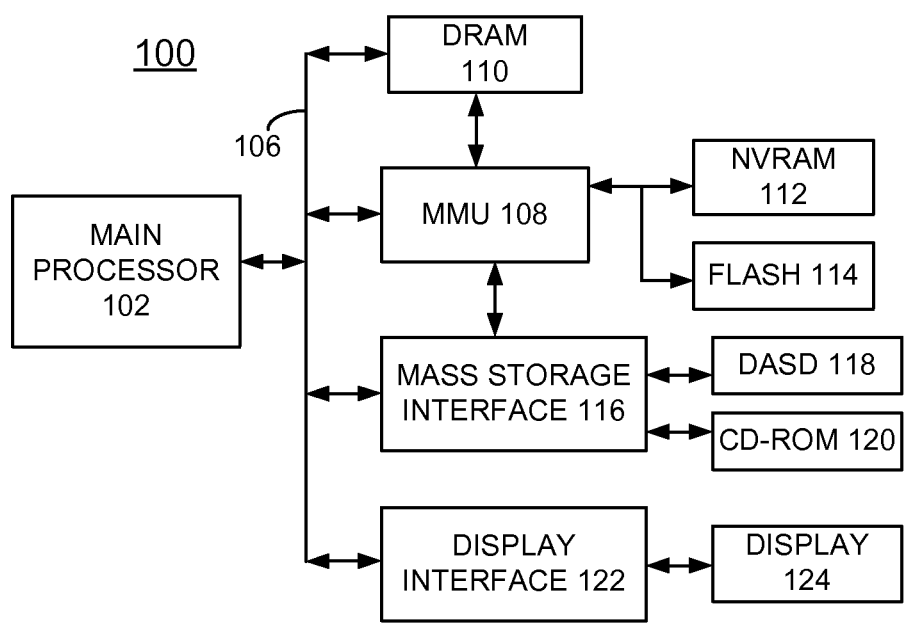
FIGS. 1A and 1B are block diagram representations illustrating an example computer system and operating system for implementing methods for fabricating enhanced adhesive layers for enhanced low loss, thin, high performance flexible circuits in a flexible circuit design in accordance with a preferred embodiment.
Figure 1B:
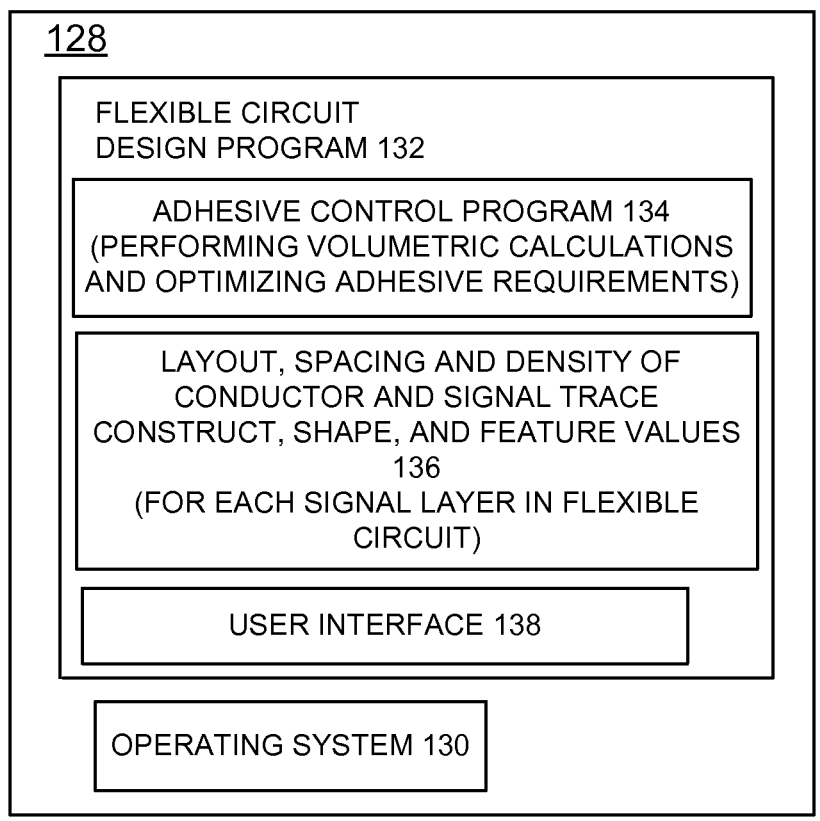

Referring now to FIGS. 1A and 1B, there is shown an example computer system generally designated by the reference character 100 for fabricating enhanced flexible circuits with optimized adhesive layers in a flexible circuit design in accordance with a preferred embodiment in accordance with preferred embodiments. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

As shown in FIG. 1B, computer system 100 includes non-transitory storage device or memory 128 storing an operating system 130, a flexible circuit design program 132, an adhesive control program 134 of a preferred embodiment performing volumetric calculations and optimizing adhesive layers, using for each signal layer in flexible circuit predefined spacing and density of conductor layout, shape and feature values 136 of the preferred embodiment, and a user interface 138.

Various commercially available computers can be used for computer system 100, for example, an IBM server computer. CPU 102 is suitably programmed by the integrated circuit design program 132, and the adhesive control program 134 for performing volumetric calculations and optimizing adhesive layers responsive to received predefined area, spacing and density of conductor layout, shape and feature values 136 for implementing enhanced fabrication of enhanced flexible circuits with optimized adhesive layers in the flexible circuit design in accordance with the preferred embodiment.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

Figure 2A:
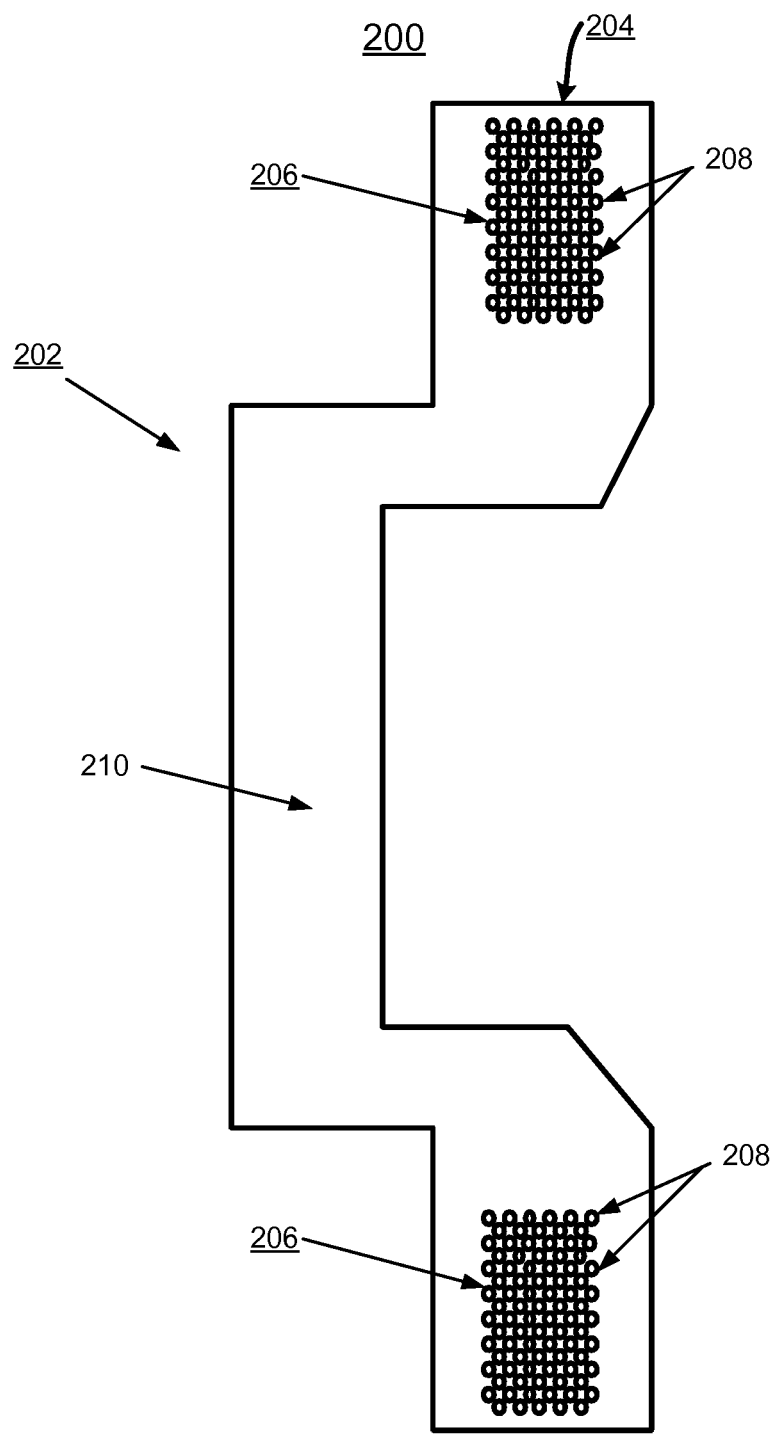
FIGS. 2A, 2B, and 2C are plan views not to scale illustrating example process steps for implementing enhanced adhesive layers in a flexible circuit design in accordance with a preferred embodiment.
Figure 2B:
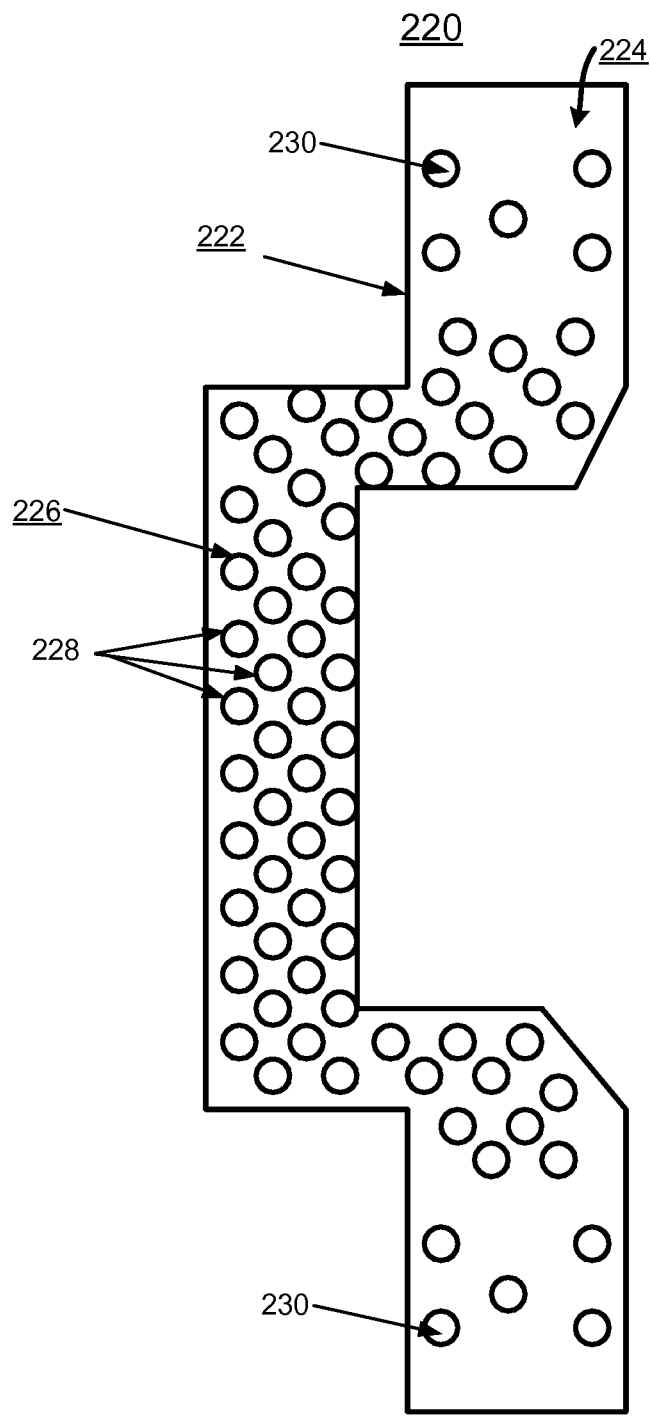
Figure 2C:
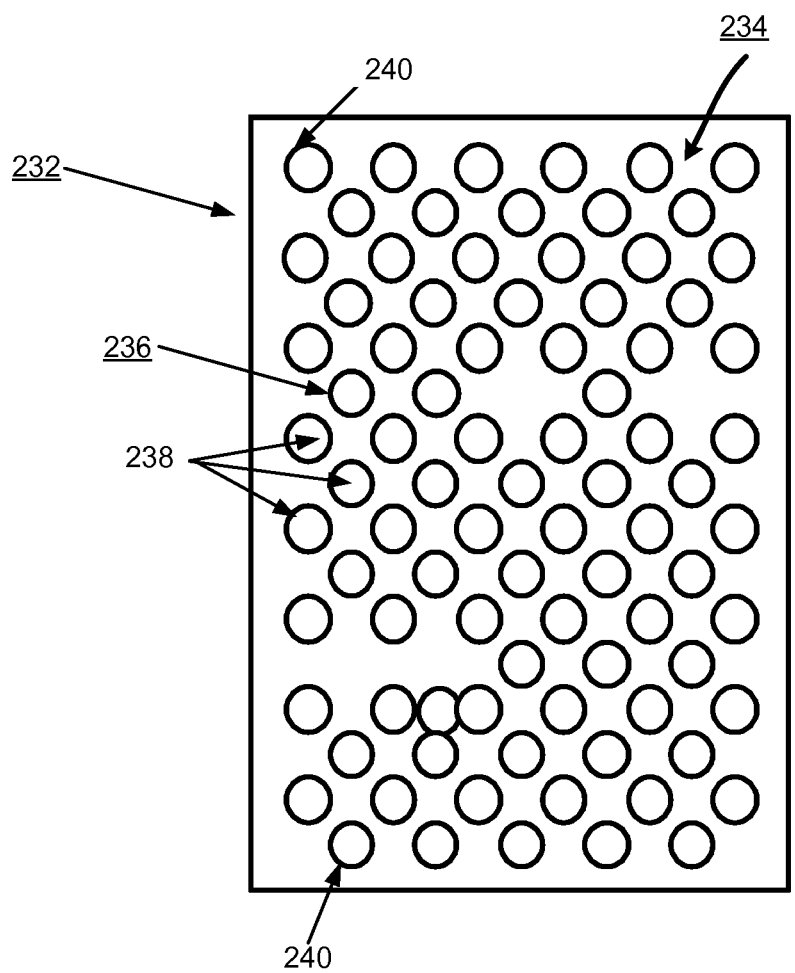

Referring now to FIGS. 2A, 2B, and 2C, there are shown plan views not to scale illustrating example process steps for implementing enhanced adhesive layers in a flexible circuit design in accordance with a preferred embodiment.

In FIG. 2A, an example initial process step generally designated by the reference character 200 is shown for implementing enhanced adhesive layers in a flexible circuit design. An example signal layer 202 in flexible circuit having an overall shape 204 is shown in process step 200 including a pair of spaced apart critical areas 206 including a plurality of cooper pads 208, and a solid ground plane 210, for example, generally extending between the critical areas 206.

In FIG. 2B, an example next process step generally designated by the reference character 220 is shown for implementing enhanced adhesive layers in a flexible circuit design. In process step 220, a first enhanced adhesive layer 222 having an overall shape 224 corresponding to the over shape 204 of the example signal layer 202 of FIG. 2A is characterized and includes a first general aperture pattern 226 of spaced apart apertures 228. The first enhanced adhesive layer 222 is characterized, for example, by drilling into or through adhesive layer 222, or by otherwise removing some material with apertures 228. Alternate methods of characterizing the adhesive layer 222 include scraping, end-milling, etching the adhesive, and optionally polyimide layers are possible.

The methods of the invention of characterizing the adhesive layers, such as the adhesive layer 222 enable customizing the cross section throughout a panel (X, Y and Z) and specifically minimize the adhesive in flex cross sections to improve performance and the ability to modify cross section in desired areas, such as critical bend areas, to improve mechanical performance. Further methods of characterizing the adhesive layer 222 are illustrated and described with respect to FIGS. 5, 6A, 6B, 7, 8A, 8B, 9 and 10.

The first general aperture pattern 226 of spaced apart apertures 228 of the characterized enhanced adhesive layer 222 reduces the adhesive against the solid ground plane to a minimum required adhesive amount and reduces the adhesive around signal traces to optimize and minimize the adhesive amount. The first enhanced adhesive layer 222 advantageously includes predefined apertures 230 used for alignment with the example signal layer 202 of FIG. 2A before lamination of the flexible circuit.

In FIG. 2C, an example next process step generally designated by the reference character 230 is shown for implementing enhanced adhesive layers in a flexible circuit design. In process step 230, a pair of enhanced adhesive layers 232 (one shown) to be applied to the first enhanced adhesive layer 222 located over and having a shape 234 corresponding to the critical areas 206 of the example signal layer 202 of FIG. 2A. Each adhesive layers 232 is characterized and includes a second general aperture pattern 236 of spaced apart apertures 238. Each characterized adhesive layers 232 provides additional adhesive volume needed to fill the critical areas 206. Copper pads 208 on the example signal layer 202 in flexible circuit generally do not need added adhesive fill. Each characterized adhesive layers 232 advantageously includes predefined apertures 240 used for alignment with the example signal layer 202 of FIG. 2A before lamination of the flexible circuit.

Figure 3A:
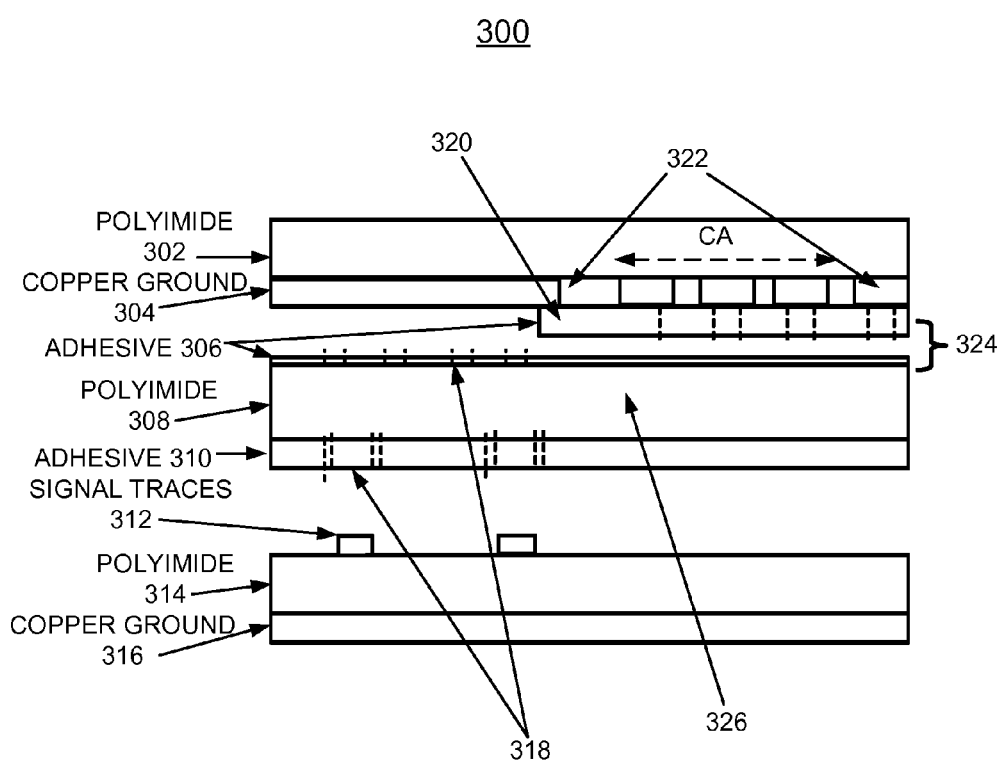
FIGS. 3A, and 3B are side views not to scale illustrating example process steps for implementing enhanced adhesive layers in a flexible circuit design in accordance with a preferred embodiment.
Figure 3B:
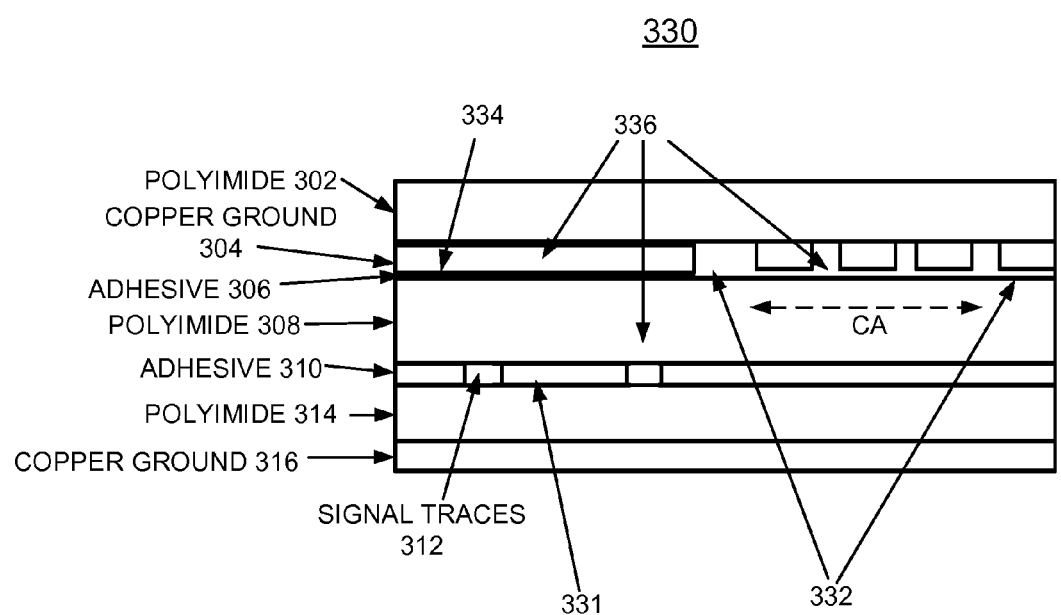

Referring also to FIGS. 3A, and 3B there are shown side views not to scale illustrating example process steps for implementing enhanced adhesive layers in a flexible circuit design in accordance with a preferred embodiment. Similar or identical features and components are identified by the same references and reference numbers in FIGS. 3A, and 3B.

In FIG. 3A, an example process step generally designated by the reference character 300 before lamination is shown for implementing enhanced adhesive layers in a flexible circuit design in accordance with a preferred embodiment. The before lamination process step 300 illustrates an upper core material layer including a flexible electrical insulator polyimide substrate 302, and an electrical conductor copper layer 304 including gaps in copper between signal traces, shapes, and connector area copper features. A dual adhesive layer 306 includes adhesive 306 carried by an electrical insulator polyimide layer 308 and adhesive 306 provided together with a portion of the copper layer 304. A second adhesive layer 310 is carried on a lower surface of the electrical insulator polyimide layer 308 disposed above signal traces 312. The signal traces 312 are carried by an electrical insulator polyimide layer 314 of a lower core material layer. A copper ground layer 316 is carried on a lower surface of the electrical insulator polyimide layer 314. An adhesive sheet thickness of adhesive layers 306 and 310 indicated by 318 decreases with characterization. The adhesive 306 provided together with a portion of the copper layer 304 indicated by 320 is provided with a critical area, such as the critical areas 206 of the conductor layer 202 in FIG. 2A. Capture pad and clearance rings are indicated by 322. An arrow labeled CA indicates the critical area of the conductor layer 304. A bracket 324 indicates that the dual adhesive layer 306 may be combined in one adhesive layer including the adhesive 306 carried by the electrical insulator polyimide layer 308 and adhesive 306 provided together with critical area CA of the copper layer 304. The thickness indicated by 326 of the electrical insulator polyimide layer 308 is increased, while the increased polyimide thickness is less than the adhesive decreased thickness to provide an overall thinner flexible circuit package.

In FIG. 3B, an example process step generally designated by the reference character 330 after lamination is shown for implementing enhanced adhesive layers in a flexible circuit design in accordance with a preferred embodiment. The after lamination process step 330 illustrates the respective adhesive layers 306 and 310 bonded to the electrical conductor layer 304 and the signal traces 312 of the respective upper and lower adjacent core material layers. An adhesive sheet thickness of adhesive layer 310 indicated by 331, which was decreased with characterization in process step 300 of FIG. 3A, is reduced to a minimum adhesive required at every location compensating for circuit density and any copper thickness. As indicated by 332, the dual adhesive layer 306 provides required fill in the critical area CA to ensure reliable cross section for the flexible circuit. As indicated by 334, the dual adhesive layer 306, which was decreased with characterization in process step 300 of FIG. 3A, reduces the adhesive to below commercially available thicknesses. As indicated by 336, the resulting cross section has a significantly reduced amount of high dissipation and high dielectric adhesive in the cross section for the overall thinner flexible circuit package.

Figure 4B:
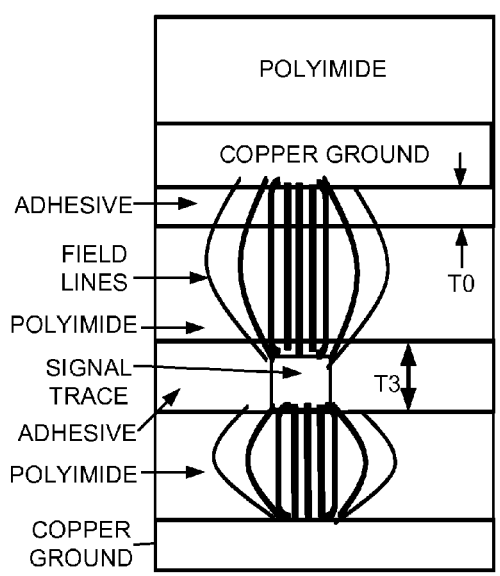
FIGS. 4A, and 4B are side views not to scale illustrating example enhanced adhesive layers in a flexible circuit in accordance with a preferred embodiment and in a prior art flexible circuit design.
Figure 4A:
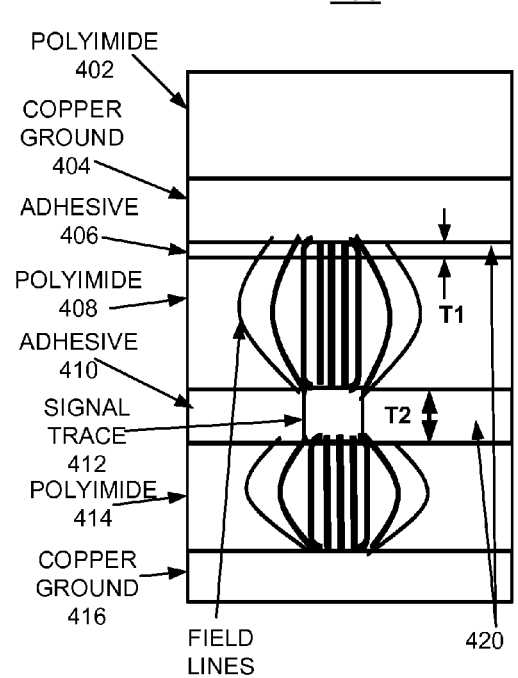

Referring also to FIGS. 4A, and 4B, there are shown side views not to scale respectively illustrating an example enhanced adhesive layers in a flexible circuit generally designated by the reference character 400 in accordance with a preferred embodiment and a prior art flexible circuit.

As shown in FIG. 4A, the flexible circuit 400 includes a flexible electrical insulator polyimide substrate 402, an electrical conductor copper layer 404, an adhesive layer 406, an electrical insulator polyimide layer 408 and a second adhesive layer 410 disposed around a signal trace 412 carried by an electrical insulator polyimide layer 414 and a copper ground layer 416 is carried on a lower surface of the electrical insulator polyimide layer 414. As indicated by 420 an adhesive thickness of adhesive layers 406 and 410 is respectively indicated by an arrow T1, T2.

Referring also to FIG. 4B, the prior art flexible circuit illustrates the convention practice and includes corresponding insulator layers having an adhesive thickness respectively indicated by an arrow T3, T4. Both adhesive layers 406 and 410 in the flexible circuit 400 of the invention have a significantly reduced thickness T1, T2 as compared to the prior art adhesive thicknesses T3, T4. The polyimide layer 408 between the adhesive layers 406 and 410 in the flexible circuit 400 of the invention is increased as compared to the corresponding prior art polyimide layer between the adhesive layers in FIG. 4B. As a result, the illustrated field lines in the flexible circuit 400 of the invention travel through less high dielectric adhesive 406, 410 and through more polyimide 408 resulting in lower insertion loss. For example, a polyimide has a 3.4 DF and 0.003 DK as compared to an FR adhesive having a 4.0 DF, and 0.02 DK.

Also replacement of high dielectric adhesive 406, 410 with more polyimide 408 results in a thinner cross section in the flexible circuit 400 of the invention in FIG. 4A, as compared to the prior art flexible circuit of FIG. 4B. Further replacement of high dielectric adhesive 406, 410 with more polyimide 408 results in less Z axis expansion, providing a more reliable flexible circuit 400 than the prior art flexible circuit.

For example, comparing the flexible circuit 400 of the prior art flexible circuit of FIG. 4B, the characterized top adhesive layer 406 decreases the FR adhesive shown from 0.5 mils to 0.1 mil. Characterized lower adhesive 410 decreases the adhesive over the signal trace 412 to near zero and decreases overall amount of adhesive before lamination in this signal density area from 1.0 mil to 0.75 mils. The FR adhesive 410 in line of sight (signal to ground) goes from 0.7 mils to 0.2 mils. The overall amount FR adhesive goes from 1.5 mils to 0.85 mils.

Figure 5:
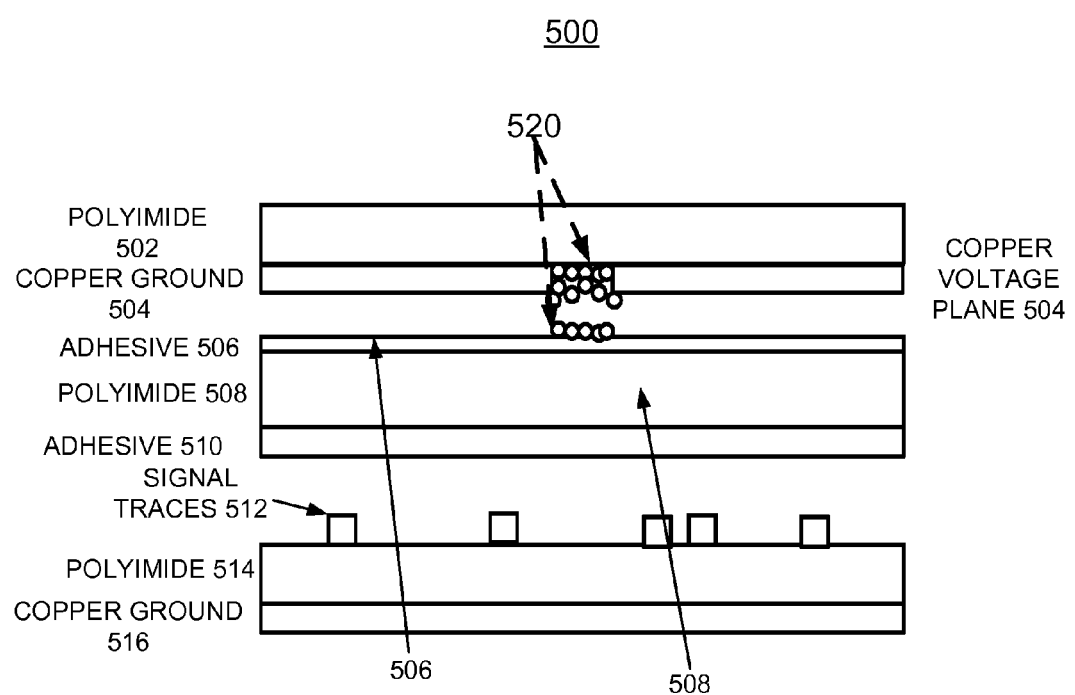
FIG. 5 is a side view not to scale illustrating another example method for implementing enhanced adhesive layers in a flexible circuit design in accordance with a preferred embodiment.
Figure 6A:
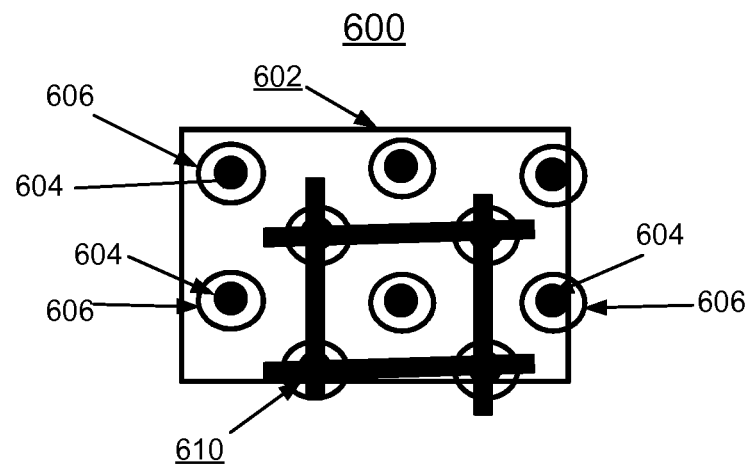
FIGS. 6A, and 6B are plan views not to scale illustrating example process steps of another example method for implementing enhanced adhesive layers in a flexible circuit design in accordance with a preferred embodiment.
Figure 6B:
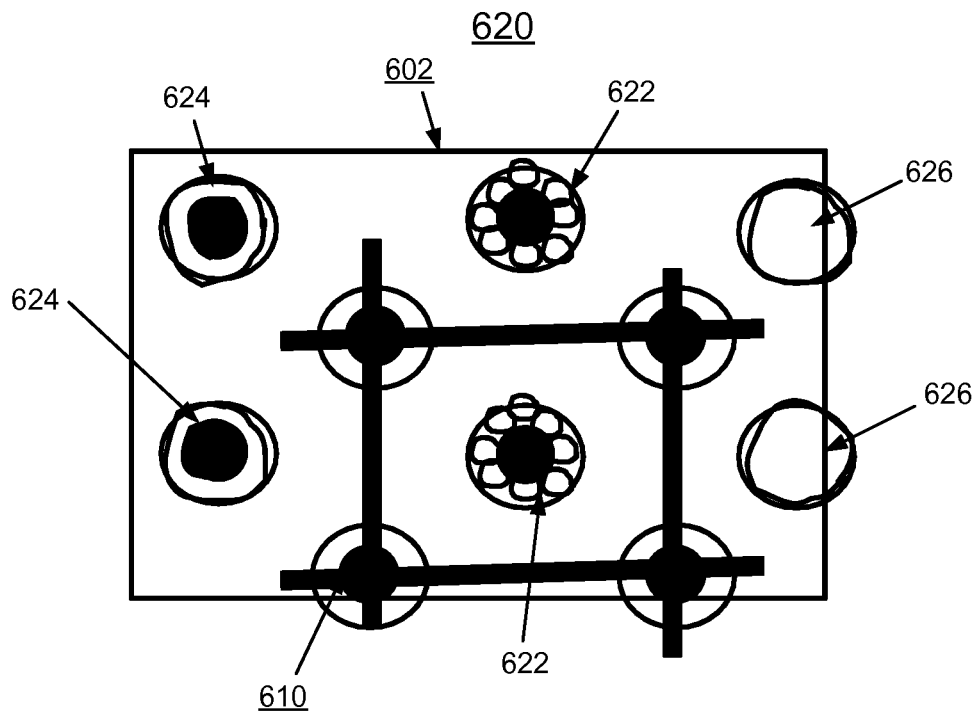

Referring now FIG. 5, FIGS. 6A, and 6B, there is shown another example method for implementing enhanced adhesive layers in a flexible circuit design in accordance with a preferred embodiment.

In FIG. 5, there is shown a flexible circuit generally designated by the reference character 500 in accordance with a preferred embodiment. The flexible circuit 500 includes a flexible electrical insulator polyimide substrate 502, and an electrical conductor copper layer 504, for example including gaps in copper between signal traces, shapes, and connector area copper features. An adhesive layer 506 is carried by an electrical insulator polyimide layer 508 and a second adhesive layer 510 is carried on a lower surface of the electrical insulator polyimide layer 508 disposed above signal traces 512. The signal traces 512 are carried by an electrical insulator polyimide layer 514 of a lower core material layer. A copper ground layer 516 is carried on a lower surface of the electrical insulator polyimide layer 514.

As indicated by 520, characterized fill is added to the core electrical conductor copper layer 504 or the bonding film adhesive layer 506, or is added to the core electrical conductor copper layer 504 and the bonding film adhesive layer 506. The adhesive layer 506 is characterized providing a reduced thickness layer. The electrical insulator polyimide layer 508 is an increased thickness layer.

In FIG. 6A, an example process step generally designated by the reference character 600 of the example method for implementing enhanced adhesive layers in the flexible circuit 500 in accordance with a preferred embodiment. For example, in process step 600, an identified critical area 602 includes a plurality of signal pins 604, each with clearance rings 606, such as the critical areas 206 including a plurality of cooper pads 208 shown in FIG. 2A, and ground pins generally designated by the reference character 610.

In FIG. 6B, a next example process step generally designated by the reference character 620 of the example method for implementing enhanced adhesive layers in the flexible circuit 500 in accordance with a preferred embodiment. For example, in process step 620, three dispensing options are shown including a discrete adhesive dispense 622, a ring adhesive dispense 624, and a circle adhesive dispense 626. After the adhesive dispense 622, the flexible circuit 500 is ready for lamination.

Figure 7:
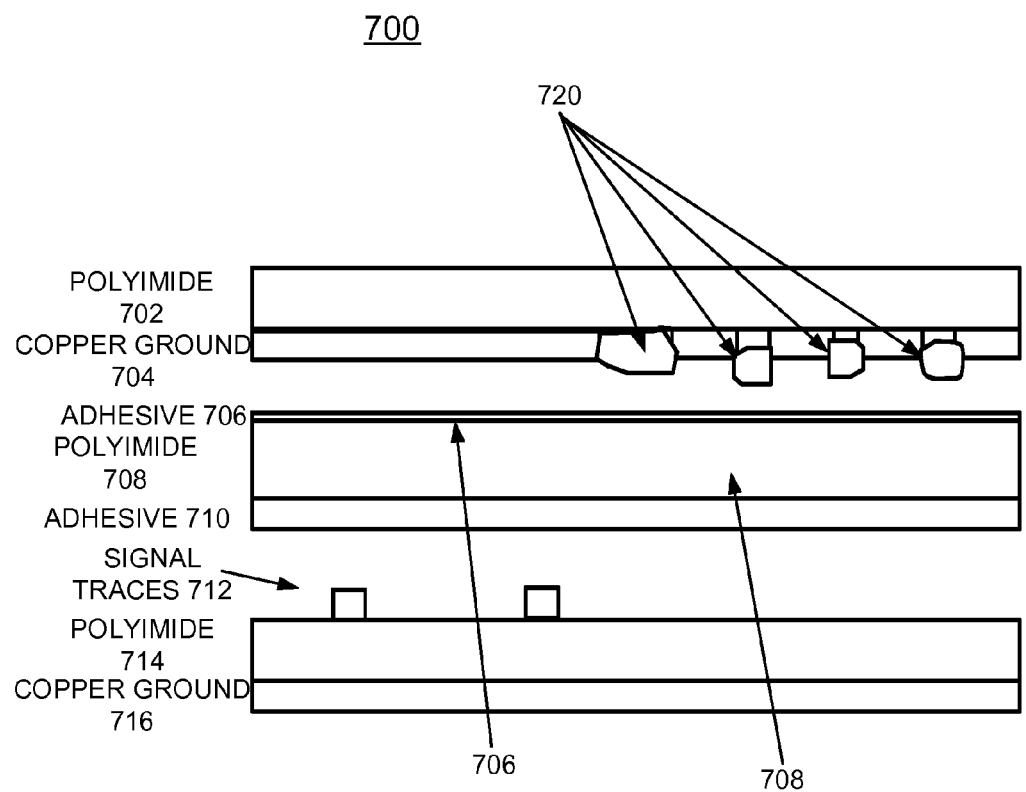
FIG. 7 is a side view not to scale illustrating another example method for implementing enhanced adhesive layers in a flexible circuit design in accordance with a preferred embodiment.

Referring to FIG. 7, there is shown a flexible circuit generally designated by the reference character 700 in accordance with a preferred embodiment. The flexible circuit 700 includes a flexible electrical insulator polyimide substrate 702, and an electrical conductor copper layer 704, for example including gaps in copper between signal traces, shapes, and connector area copper features. An adhesive layer 706 is carried by an electrical insulator polyimide layer 708 and a second adhesive layer 710 is carried on a lower surface of the electrical insulator polyimide layer 708 disposed above signal traces 712. The signal traces 712 are carried by an electrical insulator polyimide layer 714 of a lower core material layer. A copper ground layer 716 is carried on a lower surface of the electrical insulator polyimide layer 714.

As indicated by 720, adhesive after adhesive dispense is added to the core electrical conductor copper layer 704. The adhesive layer 706 is characterized providing a reduced thickness layer. The electrical insulator polyimide layer 708 is an increased thickness layer, while less than the adhesive decrease.

Figure 8A:
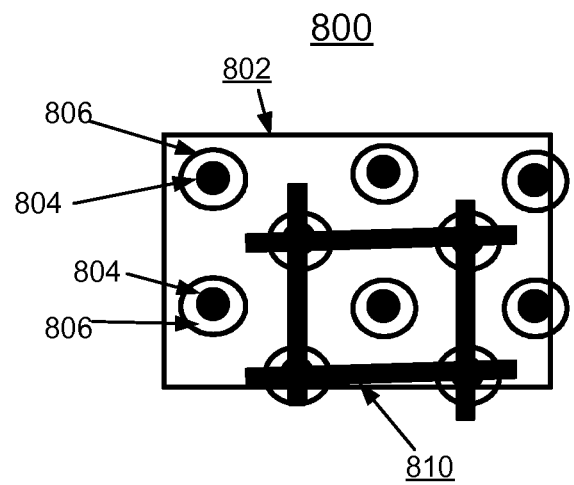
FIGS. 8A, and 8B are plan views not to scale illustrating example process steps of another example method for implementing enhanced adhesive layers in a flexible circuit design in accordance with a preferred embodiment.
Figure 8B:
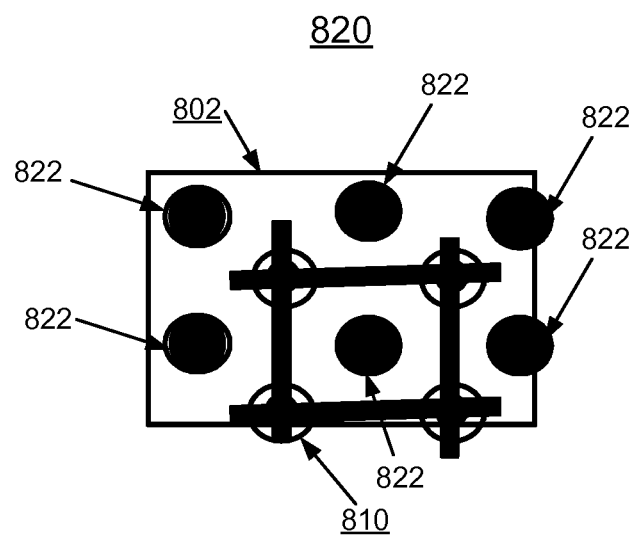
Figure 9:
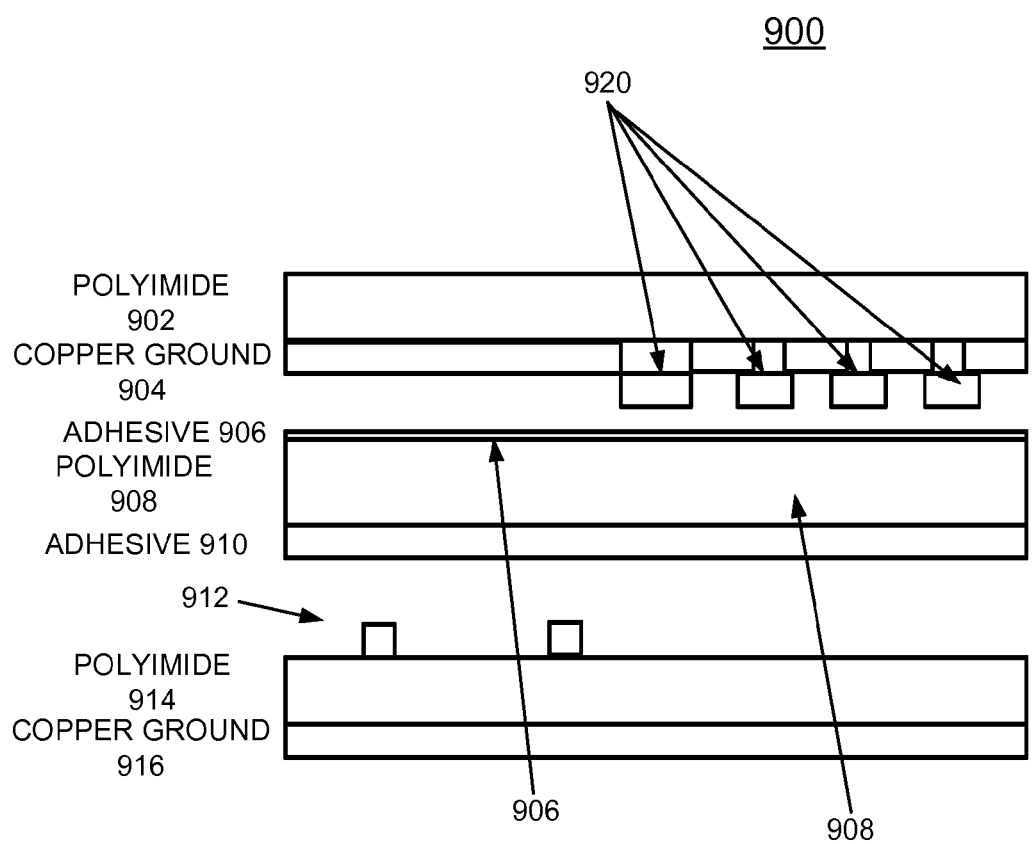
FIG. 9 is a side view not to scale illustrating another example method for implementing enhanced adhesive layers in a flexible circuit design in accordance with a preferred embodiment.

FIGS. 8A and 8B illustrate further example process steps of another example method for implementing enhanced adhesive layers in a flexible circuit design in accordance with a preferred embodiment.

In FIG. 8A, an example process step generally designated by the reference character 800 of the example method for implementing enhanced adhesive layers in the flexible circuit 700 in accordance with a preferred embodiment. For example, in process step 800, an identified critical area 802 includes a plurality of signal pins 804, each with clearance rings 806, such as the critical areas 206 including a plurality of cooper pads 208 shown in FIG. 2A, and ground pins generally designated by the reference character 810.

In FIG. 8B, a next example process step generally designated by the reference character 820 of the example method for implementing enhanced adhesive layers in the flexible circuit 700 in accordance with a preferred embodiment. For example, in process step 820, there is shown a pick and place adhesive shape 822 provided with each of the signal pins 804 and clearance rings 806. After the pick and place adhesive dispense 822, the flexible circuit 700 is ready for lamination Referring to FIG. 9, there is shown a flexible circuit generally designated by the reference character 900 in accordance with a preferred embodiment illustrating another example method for implementing enhanced adhesive layers in a flexible circuit design in accordance with a preferred embodiment. The flexible circuit 900 includes a flexible electrical insulator polyimide substrate 902, and an electrical conductor copper layer 904, for example including gaps in copper between signal traces, shapes, and connector area copper features. An adhesive layer 906 is carried by an electrical insulator polyimide layer 908 and a second adhesive layer 910 is carried on a lower surface of the electrical insulator polyimide layer 908 disposed above signal traces 912. The signal traces 912 are carried by an electrical insulator polyimide layer 914 of a lower core material layer. A copper ground layer 916 is carried on a lower surface of the electrical insulator polyimide layer 914.

A plurality of sheet adhesive shapes 920 are provided after pick and place and tack adhesive dispense is added to the core electrical conductor copper layer 904. The adhesive layer 906 is characterized providing a reduced thickness layer. The electrical insulator polyimide layer 908 is an increased thickness layer, while less than the adhesive decrease.

Figure 10:
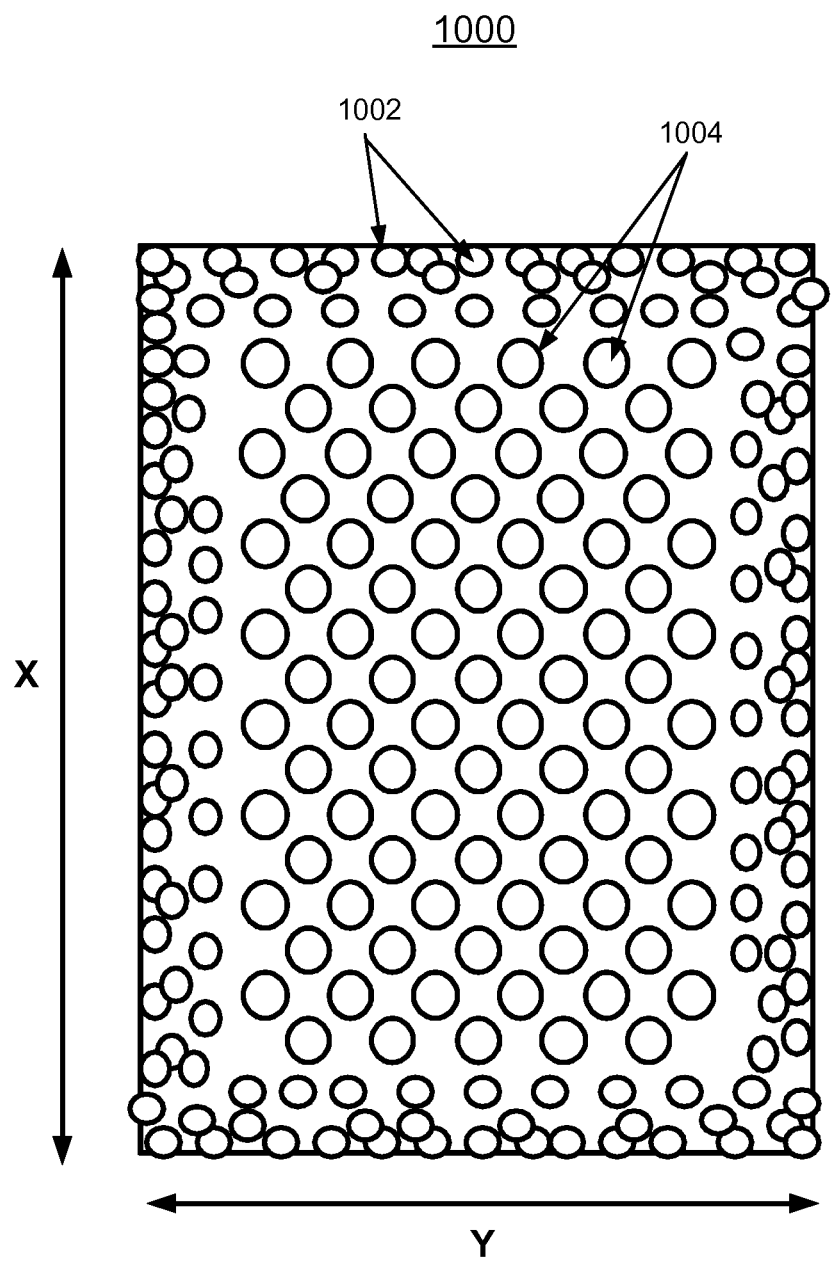
FIG. 10 is a plan view not to scale illustrating an example enhanced adhesive layer in a flexible circuit design in accordance with a preferred embodiment.

Referring to FIG. 10, there is shown an example enhanced adhesive layer in a flexible circuit design generally designated by the reference character 1000 in accordance with a preferred embodiment. The enhanced adhesive layer 1000 is characterized including a plurality of apertures 1002, 1004. For high layer count multilayer apertures or holes 1002 in the characterized sheet adhesive 1000 include increasing density at the edges to reduce step function of added adhesive. Also the characterized enhanced adhesive layer 1000 can be implemented with slightly different sizes varying dimensions indicated by arrows labeled X, Y for use on various layers of a multilayer flexible circuit. Further slightly different shapes, for example, shapes are skewed from the illustrated rectangular enhanced adhesive layer 1000 for use on various layers of a multilayer flexible circuit.

Figure 11:
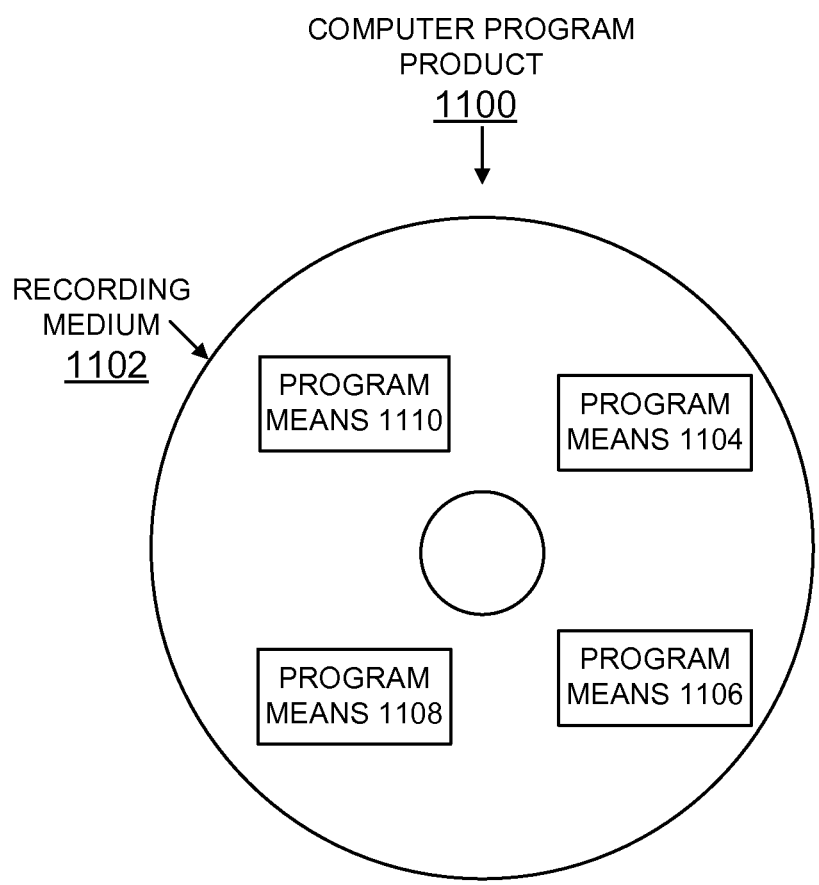
FIG. 11 is a block diagram illustrating a computer program product in accordance with the preferred embodiment.

Referring now to FIG. 11, an article of manufacture or a computer program product 1100 of the invention is illustrated. The computer program product 1100 is tangibly embodied in a non-transitory machine readable recording medium 1102, such as, a floppy disk, a high capacity read only memory in the form of an optically read compact disk or CD-ROM, a tape, or another similar computer program product. Recording medium 1102 stores program means 1104, 1108, 1108, 1110 on the medium 1102 for carrying out the methods for implementing enhanced adhesive layers in a flexible circuit design of the preferred embodiment in the system 100 of FIGS. 1A and 1B.

A sequence of program instructions or a logical assembly of one or more interrelated modules defined by the recorded program means 1104, 1108, 1108, 1110; direct the computer system 100 for implementing enhanced adhesive layers in a flexible circuit design of the preferred embodiment.

While the present invention has been described with reference to the details of the embodiments of the invention shown in the drawing, these details are not intended to limit the scope of the invention as claimed in the appended claims.

What is claimed is:

1. A method for implementing enhanced low loss, thin, high performance flexible circuits performed by a processor, said method comprising:
   said processor performing the steps of:
   receiving a plurality of predefined values including predefined layout, spacing and density of conductor, signal trace construct, shape and feature values for each signal layer in a flexible circuit;
   performing volumetric calculations using the predefined values for each signal layer in the flexible circuit; and
   responsive to said volumetric calculations, characterizing a respective adjacent adhesive layer for each signal layer providing an optimized adjacent adhesive layer; and
   wherein characterizing said respective adjacent adhesive layer for each signal layer providing said optimized adjacent adhesive layer includes strategically reducing an amount of adhesive residing within a signal trace geometry cross section and providing an increased thickness of an electrical insulator polyimide layer having a lower dissipation and dielectric properties, lower coefficient of thermal expansion (CTE), providing a reduced overall cross sectional thickness for the flexible circuit.

2. The method as recited in claim 1 wherein characterizing said respective adjacent adhesive layer for each signal layer providing said optimized adjacent adhesive layer includes characterizing said respective adjacent adhesive layer for forming at least one predefined aperture pattern in said respective adjacent adhesive layer.

3. The method as recited in claim 1 wherein characterizing said respective adjacent adhesive layer for each signal layer providing said optimized adjacent adhesive layer includes adding characterized adhesive fill to an adjacent signal layer or said respective adjacent adhesive layer.

4. The method as recited in claim 1 wherein characterizing said respective adjacent adhesive layer for each signal layer providing said optimized adjacent adhesive layer includes adding characterized adhesive fill to a selected connector area of an adjacent signal layer.

5. The method as recited in claim 1 wherein characterizing said respective adjacent adhesive layer for each signal layer providing said optimized adjacent adhesive layer includes characterizing said respective adjacent adhesive layer to modify a cross section in a critical bend area to enhance mechanical performance.

6. The method as recited in claim 1 wherein characterizing said respective adjacent adhesive layer for each signal layer providing said optimized adjacent adhesive layer includes characterizing said respective adjacent adhesive layer for selectively reducing a thickness at multiple areas of said respective optimized adjacent adhesive layer to a minimum predefined adhesive compensating for circuit density and copper thickness values.

7. The method as recited in claim 1 wherein characterizing said respective adjacent adhesive layer for each signal layer providing said optimized adjacent adhesive layer includes characterizing said respective adjacent adhesive layer for minimizing a thickness of said respective optimized adjacent adhesive layer providing enhanced thermal expansion for the flexible circuit.

8. The method as recited in claim 1 includes providing an electrical insulator polyimide layer with said respective optimized adjacent adhesive layer, and increasing a thickness of said electrical insulator polyimide layer with a decrease in a thickness of said respective optimized adjacent adhesive layer.

9. A system for implementing enhanced low loss, thin, high performance flexible circuits comprising:
   a processor,
   a flexible circuit design program tangibly embodied in a non-transitory machine readable medium used in the flexible circuit design process, said flexible circuit design program including an adhesive control program, and
   said processor using said adhesive control program, receiving a plurality of predefined values including predefined layout, spacing and density of conductor, signal trace construct, shape and feature values for each signal layer in a flexible circuit;
   said processor performing volumetric calculations using the predefined values for each signal layer in the flexible circuit; and
   said processor responsive to said volumetric calculations, characterizing a respective adjacent adhesive layer for each signal layer providing an optimized adjacent adhesive layer; wherein said processor responsive to said volumetric calculations, characterizing a respective adjacent adhesive layer for each signal layer providing an optimized adjacent adhesive layer includes said processor strategically reducing an amount of adhesive residing within a signal trace geometry cross section and providing an increased thickness of an electrical insulator polyimide layer having a lower dissipation and dielectric properties, lower coefficient of thermal expansion (CTE), providing a reduced overall cross sectional thickness for the flexible circuit.

10. The system as recited in claim 9 wherein said processor responsive to said volumetric calculations, characterizing a respective adjacent adhesive layer for each signal layer providing an optimized adjacent adhesive layer includes said processor characterizing said respective adjacent adhesive layer for forming at least one predefined aperture pattern in said respective adjacent adhesive layer.

11. The system as recited in claim 9 wherein said processor responsive to said volumetric calculations, characterizing a respective adjacent adhesive layer for each signal layer providing an optimized adjacent adhesive layer includes said processor characterizing said respective adjacent adhesive layer for selectively reducing a thickness at multiple areas of said respective optimized adjacent adhesive layer to a minimum predefined adhesive compensating for circuit density and copper thickness values.

12. The system as recited in claim 9 wherein said processor responsive to said volumetric calculations, characterizing a respective adjacent adhesive layer for each signal layer providing an optimized adjacent adhesive layer includes said processor characterizing said respective adjacent adhesive layer for minimizing a thickness of said respective optimized adjacent adhesive layer providing enhanced thermal expansion for the flexible circuit.

13. The system as recited in claim 9 includes said processor providing an electrical insulator polyimide layer with said respective optimized adjacent adhesive layer, and increasing a thickness of said electrical insulator polyimide layer with a decrease in a thickness of said respective optimized adjacent adhesive layer.

14. A non-transitory machine readable medium with a flexible circuit design computer program product for implementing enhanced low loss, thin, high performance flexible circuits in a computer system, said computer program product tangibly embodied in a non-transitory machine readable medium used in the integrated circuit design process, said flexible circuit design computer program product including an adhesive control program, said flexible circuit design computer program product including instructions executed by the computer system to cause the computer system to perform the steps of:
receiving a plurality of predefined values including predefined layout, spacing and density of conductor, signal trace construct, shape and feature values for each signal layer in a flexible circuit;
performing volumetric calculations using the predefined values for each signal layer in the flexible circuit; and
responsive to said volumetric calculations, characterizing a respective adjacent adhesive layer for each signal layer providing an optimized adjacent adhesive layer;
wherein characterizing said respective adjacent adhesive layer for each signal layer providing said optimized adjacent adhesive layer includes strategically reducing an amount of adhesive residing within a signal trace geometry cross section and providing an increased thickness of an electrical insulator polyimide layer having a lower dissipation and dielectric properties, lower coefficient of thermal expansion (CTE), providing a reduced overall cross sectional thickness for the flexible circuit.

15. The non-transitory machine readable medium with the flexible circuit design computer program product as recited in claim 14 wherein characterizing said respective adjacent adhesive layer for each signal layer providing said optimized adjacent adhesive layer includes characterizing said respective adjacent adhesive layer for forming at least one predefined aperture pattern in said respective adjacent adhesive layer.

16. The non-transitory machine readable medium with the flexible circuit design computer program product as recited in claim 14 wherein characterizing said respective adjacent adhesive layer for each signal layer providing said optimized adjacent adhesive layer includes characterizing said respective adjacent adhesive layer for selectively reducing a thickness at multiple areas of said respective optimized adjacent adhesive layer to a minimum predefined adhesive compensating for circuit density and copper thickness values.

17. The non-transitory machine readable medium with the flexible circuit design computer program product as recited in claim 14 wherein characterizing said respective adjacent adhesive layer for each signal layer providing said optimized adjacent adhesive layer includes characterizing said respective adjacent adhesive layer for minimizing a thickness of said respective optimized adjacent adhesive layer providing enhanced thermal expansion for the flexible circuit.

18. The non-transitory machine readable medium with the flexible circuit design computer program product as recited in claim 14 includes providing an electrical insulator polyimide layer with said respective optimized adjacent adhesive layer, and increasing a thickness of said electrical insulator polyimide layer with a decrease in a thickness of said respective optimized adjacent adhesive layer.

19. The non-transitory machine readable medium with the flexible circuit design computer program product as recited in claim 14 wherein characterizing said respective adjacent adhesive layer for each signal layer providing said optimized adjacent adhesive layer includes adding characterized adhesive fill to an adjacent signal layer or said respective adjacent adhesive layer.

20. The non-transitory machine readable medium with the flexible circuit design computer program product as recited in claim 14 wherein characterizing said respective adjacent adhesive layer for each signal layer providing said optimized adjacent adhesive layer includes characterized adhesive fill to a selected connector area of an adjacent signal layer.

21. The non-transitory machine readable medium with the flexible circuit design computer program product as recited in claim 14 wherein characterizing said respective adjacent adhesive layer for each signal layer providing said optimized adjacent adhesive layer includes characterizing said respective adjacent adhesive layer to modify a cross section in a critical bend area to enhance mechanical performance.

* * * * *